United States Patent
Baker et al.

(10) Patent No.: US 7,482,961 B1
(45) Date of Patent: Jan. 27, 2009

(54) DIGITAL FEEDTHROUGH CANCELLATION

(75) Inventors: Dan Baker, Medina, OH (US); Michael D. Rayman, Akron, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/760,047

(22) Filed: Jun. 8, 2007

(51) Int. Cl.
*H03M 1/66* (2006.01)
(52) U.S. Cl. .................. 341/144; 341/145
(58) Field of Classification Search .......... 341/144, 341/145; 370/210
See application file for complete search history.

(56) References Cited

U.S. PATENT DOCUMENTS

2004/0213146 A1 * 10/2004 Jones et al. ................. 370/210

* cited by examiner

*Primary Examiner*—Rexford Barnie
*Assistant Examiner*—Joseph Lauture
(74) *Attorney, Agent, or Firm*—Pearne & Gordon LLP

(57) ABSTRACT

A method for operating a DAC to minimize digital feedthrough includes inputting a clock signal to a DAC clock input, the clock signal having a periodic series of trigger events, wherein input data must be present for a time window between a setup time before a trigger event and a hold time after the trigger event; generating an input data stream, the input data stream having data that is present for the time window; altering the input data stream into a cancellation data stream wherein the data presence is maintained but pseudo-data outside of the time window is added; and applying the cancellation data stream to a DAC data input resulting in an analog signal output.

3 Claims, 1 Drawing Sheet

DIGITAL FEEDTHROUGH CANCELLATION

BACKGROUND OF THE INVENTION

The present invention relates to digital to analog conversion and, in particular, to cancellation of digital feedthrough.

Many digital to analog conversion (DAC) circuits have issues with unacceptable digital signal interference feeding through to the analog signal. The problem is that a minute amount of capacitance between the digital inputs and the analog outputs can be enough to couple the two.

Typically, DACs operate with a clock input and a data input. A trigger event (e.g., a rising clock edge, a falling clock edge, or both) latches the data input into the DAC. For this data latching to happen, the data is required to be present for a time window between a "setup time" before the trigger event and a "hold time" after the trigger event.

Referring to FIG. 2, an example timing diagram for a parallel-input DAC that uses the rising edge as the trigger event is shown. An example time window A is shown about a rising clock edge.

For example, where a sine wave is being generated, the most significant bit of the data input will have a significant content of the frequency that is being outputted and this content will couple through the capacitance to the analog signal output, corrupting the analog waveform. This is possibly true even for very small signal levels, where the average of the signal is zero and it toggles between positive and negative output.

SUMMARY OF THE INVENTION

A method for operating a DAC to minimize digital feedthrough includes inputting a clock signal to a DAC clock input, the clock signal having a periodic series of trigger events, wherein input data must be present for a time window between a setup time before a trigger event and a hold time after the trigger event; generating an input data stream, the input data stream having data that is present for the time window; altering the input data stream into a cancellation data stream wherein the data presence is maintained but pseudo-data outside of the time window is added; and applying the cancellation data stream to a DAC data input resulting in an analog signal output.

DESCRIPTION OF THE PREFERRED EMBODIMENTS

Figure 2:
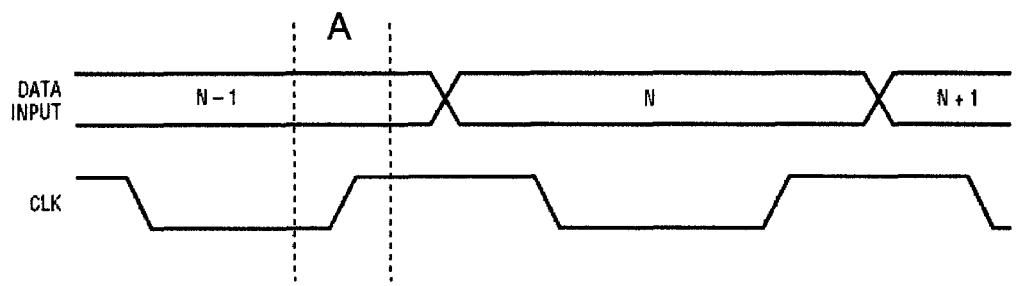
FIG. 2 is a graph of a typical prior art DAC timing diagram.

Referring to FIG. 2, it can be noted that the actual data input only has to be present in a time window A about the trigger event, i.e., between a setup time before the trigger event and a hold time after the trigger event. Outside of a time window, the data does not have to be any particular value.

This circumstance can be exploited to minimize the troublesome frequency content in the data stream and, as a result, minimize the digital feedthrough to the analog output.

Figure 1:
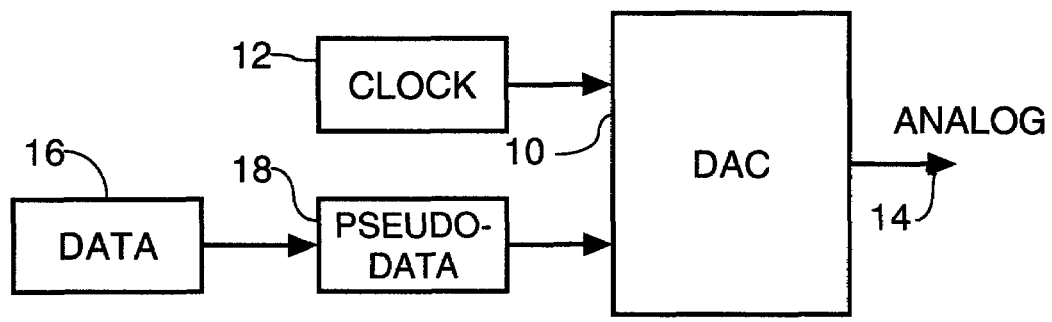
FIG. 1 is a block diagram of a DAC configuration suitable for implementing a method according to the invention.

Referring to FIG. 1, a DAC 10 has a clock input signal 12 and an analog output signal 14. In the prior art, a data stream 16, similar to that shown in FIG. 2 would be input to the DAC 10. Instead, the data stream 16 has pseudo-data 18 added to the stream to create a cancellation data stream before the data is applied to the DAC 10. An example of a timing diagram for such a cancellation data stream is illustrated in FIG. 3.

Figure 3:
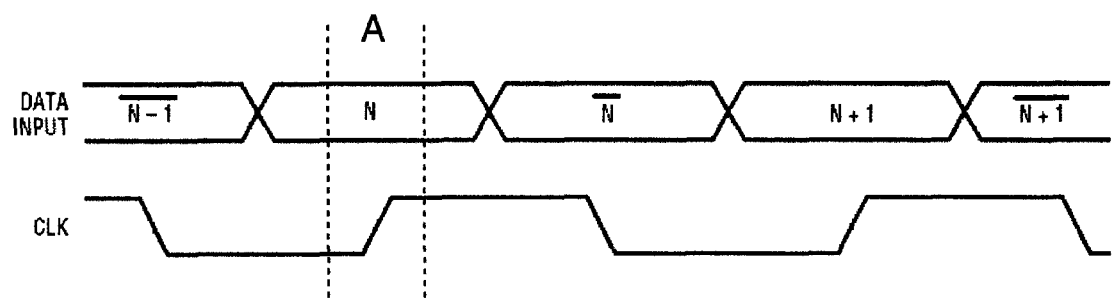
FIG. 3 is a graph of an example of a DAC timing diagram according to an aspect of the invention.

It should be noted that the cancellation data stream of FIG. 3 still has the data stream 16 values present at the time window A. In the example of FIG. 3, the cancellation data stream is basically the bit rate of the data stream of FIG. 2 doubled with the extra bits filled in as the inverted value of the preceding actual data bit. The addition of the pseudo-data outside of the time windows results in a significant change in the frequency content of the data input to the DAC 10 while the DAC 10 is still controlled by the desired data 16. The use of the cancellation data stream moves most of the energy of the DAC data input signal to a part of the spectrum where, for example, analog filters can easily remove it, because it does not have the same spectrum as the analog output signal.

In general, the DAC is operated to minimize digital feedthrough by altering the input data stream into a cancellation data stream where the data presence in the time window is maintained but pseudo-data outside of the time window is added. The cancellation data stream is applied to the DAC data input resulting in an analog signal output with the digital feed through cancelled.

The examples above use a rising clock edge as a trigger event, but other trigger events such as a falling clock edge or both the rising and the falling edge may be used to establish a time window for the data stream. In addition, many different pseudo-data configurations may be used.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for operating a DAC to minimize digital feedthrough, said DAC having a clock input and a data input, said method comprising:
   inputting a clock signal to said DAC clock input, said clock signal having a periodic series of trigger events, wherein input data must be present for a time window between a setup time before a trigger event and a hold time after said trigger event;
   generating an input data stream, said input data stream having data that is present for said time window;
   altering said input data stream into a cancellation data stream wherein said data presence is maintained but pseudo-data outside of said time window is added; and
   applying said cancellation data stream to said DAC data input resulting in an analog signal output.

2. A method according to claim 1, wherein said trigger event is at least one of a rising edge or a falling edge of said clock signal.

3. A method for operating a DAC to minimize digital feedthrough, said DAC having a clock input and a data input, said method comprising:
   inputting a clock signal to said DAC clock input, said clock signal having a periodic series of trigger events, wherein input data must be present for a time window between a setup time before a trigger event and a hold time after said trigger event;
   generating an input data stream, said input data stream having data that is present for said time window;
   altering said input data stream into a cancellation data stream wherein said data presence is maintained but pseudo-data outside of said time window is added; and
   applying said cancellation data stream to said DAC data input resulting in an analog signal output, wherein the cancellation data stream is at twice the bit rate of the input data stream with said pseudo-data including the digital inverse of the preceding input data value of said input data stream.

* * * * *